United States Patent
Liu

(10) Patent No.: US 7,863,666 B2
(45) Date of Patent: Jan. 4, 2011

(54) CAPACITOR PAIR STRUCTURE FOR INCREASING THE MATCH THEREOF

(75) Inventor: Chih-Min Liu, Taipei (TW)

(73) Assignee: Via Technologies, Inc., Taipei (TW)

( * ) Notice: Subject to any disclaimer, the term of this patent is extended or adjusted under 35 U.S.C. 154(b) by 122 days.

(21) Appl. No.: 12/219,364

(22) Filed: Jul. 21, 2008

(65) Prior Publication Data

US 2008/0315275 A1 Dec. 25, 2008

Related U.S. Application Data

(62) Division of application No. 10/963,628, filed on Oct. 14, 2004, now Pat. No. 7,417,275.

(30) Foreign Application Priority Data

Dec. 31, 2003 (TW) .............................. 92137848 A

(51) Int. Cl.
*H01L 29/92* (2006.01)
(52) U.S. Cl. ................. 257/308; 257/307; 257/309; 257/E29.343
(58) Field of Classification Search ................. 257/307, 257/308
See application file for complete search history.

(56) References Cited

U.S. PATENT DOCUMENTS

| 5,583,359 | A | 12/1996 | Ng et al. |
| 5,916,313 | A | 6/1999 | Brown |
| 6,949,823 | B2 | 9/2005 | Schott et al. |
| 6,963,175 | B2 | 11/2005 | Archenhold et al. |
| 2003/0183884 | A1* | 10/2003 | Miyazawa .................. 257/401 |
| 2004/0031982 | A1 | 2/2004 | Devries et al. |
| 2004/0046230 | A1 | 3/2004 | Bernstein et al. |
| 2005/0127881 | A1 | 6/2005 | Sase et al. |
| 2006/0006496 | A1 | 1/2006 | Harris et al. |
| 2006/0013571 | A1 | 1/2006 | Squibb |

* cited by examiner

*Primary Examiner*—Wael M Fahmy
*Assistant Examiner*—Abul Kalam
(74) *Attorney, Agent, or Firm*—Muncy, Geissler, Olds & Lowe, PLLC

(57) ABSTRACT

A capacitor pair structure for increasing the match thereof has two finger electrode structures interlacing with each other in parallel and a common electrode being between the two finger electrode structures to form a capacitor pair structure with an appropriate ratio. Also, the capacitor pair structure could further increase its entire capacitance through vias connecting the same capacitor pair structures on different metal layers.

8 Claims, 7 Drawing Sheets

CAPACITOR PAIR STRUCTURE FOR INCREASING THE MATCH THEREOF

This application is a Divisional of application Ser. No. 10/963,628 filed Oct. 14, 2004, now U.S. Pat. No. 7,417,275 and for which priority is claimed under 35 U.S.C. §120; and this application claims priority of Application No. 092137848 filed in Taiwan, R.O.C. on Dec. 31, 2003 under U.S.C. §119; the entire contents of all are hereby incorporated by reference.

BACKGROUND OF THE INVENTION

1. Field of the Invention

This invention generally relates to a capacitor pair structure, and more particularly, to a capacitor pair structure that increases the match thereof.

2. Description of the Prior Art

Referring to FIG. 1A, a multi-layer stacked capacitor structure is illustrated. The first conductive layer 110 parallels to the third conductive layer 130 and connects to the third conductive layers 130 by a conducting wire to form an end of a multi-layer capacitor structure 100. The second conductive layer 120 parallels to the fourth conductive layer 140 and connects to the fourth conductive layer 140 by another conducting wire to form the other end of the multi-layer capacitor structure 100. Herein, the second conductive layer 120 is equidistantly inserted between the first conductive layer 110 and the third conductive 130 in parallel, and the third conductive layer 130 is equidistantly inserted between the second conductive layer 120 and the fourth conductive 140 in parallel, so that a so-called sandwich structure is formed and its capacitance in a unit volume increases through converging stray capacitance that exists among conductive layers. However, in terms of the downside of the first conductive layer 110 and the upside of the fourth conductive layer 140, the stray capacitance is also generated while other conductive layers paralleling to them, and further affects the operations of a circuit, especially, in high frequency. And, the quantity of the stray capacitance is a direct ratio to the areas of the conductive layers, that is, while the areas of the multi-layer stacked capacitor structure 100 increase, not only its capacitance increases, but also the stray capacitance outside its two ends also increases.

Referring to FIG. 1B, a fringe capacitor structure is illustrated. A plurality of conducting strips 112 and 114 are in parallel and interlace to each other to form the first conductive layer 110, and through appropriately connecting, the conducting strips 112 couple to adjacent conducting strips 114 to form fringe capacitors $C_f$. A plurality of conducting strips 124 and 122 are in parallel and interlace to each other to form the second conductive layer 120, and are over and in parallel to the corresponding conducting strips 112 and 114. Through appropriately connecting, the conducting strips 124 couple to adjacent conducting strips 122 to form fringe capacitors $C_f$, in the meanwhile, the conducting strips 122 and 124 respectively couple to the corresponding conducting strips 112 and 114 to form stray capacitors $C_s$. A plurality of conducting strips 132 and 134 are in parallel and interlace to each other to form the third conductive layer 130, and are over and in parallel to the corresponding conducting strips 124 and 122. Through appropriately connecting, the conducting strips 132 couple to adjacent conducting strips 134 to form fringe capacitors $C_f$, in the meanwhile, the conducting strips 132 and 134 respectively couple to the corresponding conducting strips 124 and 122 to form stray capacitors $C_s$. Similarly, a plurality of conducting strips 144 and 142 are in parallel and interlace to each other to form the fourth conductive layer 140 and also to form fringe capacitors $C_f$ at the same time, also to form stray capacitors $C_s$ between the corresponding conducting strips 132 and 134. The rest conductive layers may be deduced by analogy. Finally, the maximum capacitance in a unit volume can be obtained through integrating all fringe capacitors $C_f$ and stray capacitors $C_s$.

The well-known capacitor structures mentioned above describe a single capacitor as an independent unit. However, while a circuit requires a capacitor pair application, two independent capacitors are hence connected together. Doing in this way, it causes not only the waste of circuit layout, but also the instable match between the two capacitors. For example, a capacitor layout on a wafer periphery originally has a fixed proportion to another capacitor layout on the wafer center. However, the fixed proportion might be changed due to the slightly different thickness between the wafer periphery and the wafer center, or due to a high current circuit layout just beside any one of the capacitor layouts. In addition, the stray capacitance generated from the outside of the electrodes also interferes with the capacitor pair working in high frequency.

In view of the drawbacks mentioned with the prior art of capacitor pair structure, there is a continued need to develop a new and improved structure that overcomes the disadvantages associated with the prior art of capacitor pair structure. The advantages of this invention are that it solves the problems mentioned above.

SUMMARY OF THE INVENTION

In accordance with the present invention, a capacitor pair structure for increasing the match thereof substantially obviates one or more of the problems resulted from the limitations and disadvantages of the prior art mentioned in the background.

Accordingly, one object of the present invention is to provide a fringe capacitor pair structure that keeps the same capacitance as the original value while the areas of the conductive layers are reduced.

Another object is to provide two finger electrode structures interlacing with each other and a common electrode being between the two finger electrode structures, so as to increase the match and the layout density of the capacitor pair.

Still another object is to provide a common electrode being between the two finger electrode structures interlacing with each other, so as to reduce the stray capacitance generated from the outside of the capacitor electrodes through reducing the areas of the common electrode.

According to the aforementioned objects, the present invention provides a capacitor pair structure for increasing the match thereof. The capacitor pair structure includes a first finger electrode structure having a first electrode and a plurality of first extended electrodes, the plurality of first extended electrodes paralleling to each other and connecting to the first electrode; a second finger electrode structure having a second electrode and a plurality of second extended electrodes, the plurality of second extended electrodes paralleling to each other and connecting to the second electrode, wherein the second finger electrode structure interlaces with the first finger electrode structure to form an interlaced finger electrode structure; and a third electrode structure being between the interlaced finger electrode structure.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Moreover, some irrelevant details are not drawn in order to make the illustrations concise and to provide a clear description for easily understanding the present invention.

Figure 1A:
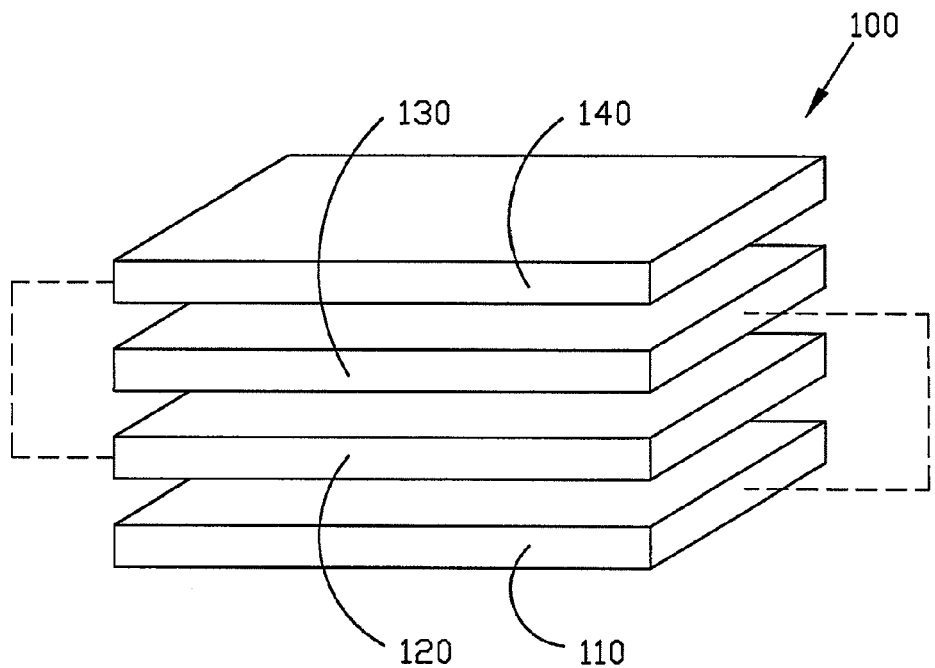
FIG. 1A illustrates a well-known multi-layer stacked capacitor structure.
Figure 1B:
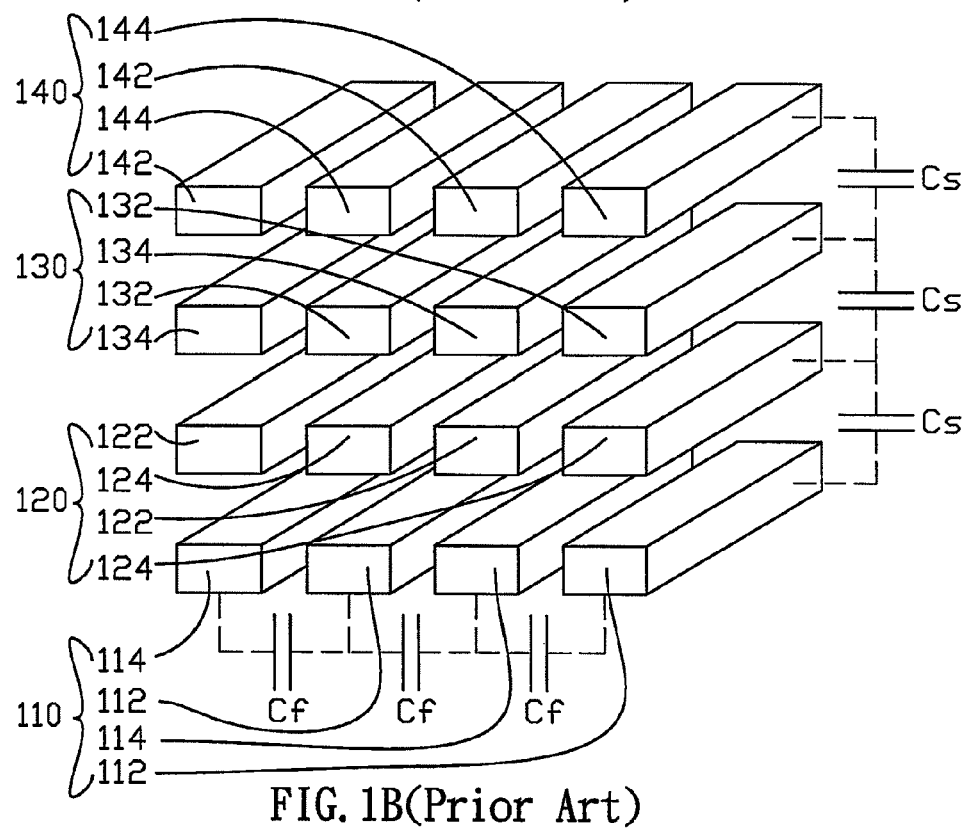
FIG. 1B illustrates a well-known fringe capacitor structure.
Figure 2A:
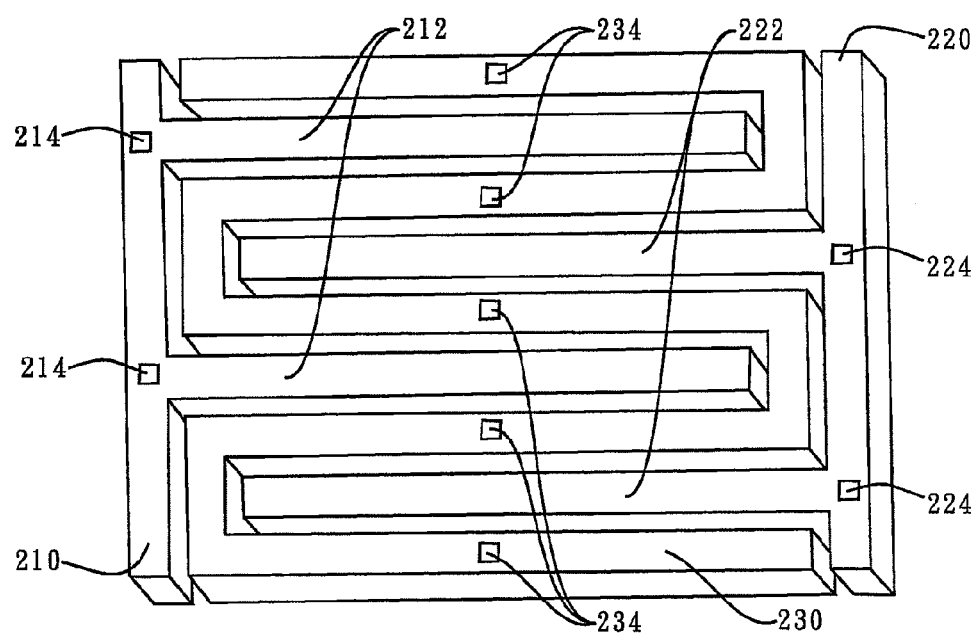
FIG. 2A illustrates a preferred capacitor pair structure in accordance with the present invention.

Referring to FIG. 2A, a preferred capacitor pair structure in accordance with the present invention is illustrated. A first finger electrode structure includes a first electrode 210 and a plurality of first extended electrodes 212, wherein the plurality of first extended electrodes 212 equidistantly parallel to each other and vertically connect to the first electrode 210. A second finger electrode structure includes a second electrode 220 and a plurality of second extended electrodes 222, wherein the plurality of second extended electrodes 222 equidistantly parallel to each other and vertically connect to the second electrode 220. The two finger electrode structures mentioned above form a so-called interlaced finger electrode structure through the layout of interlacing to each other. This makes the plurality of first extended electrodes 212 be equidistantly and in parallel interlaced among the plurality of first extended electrodes 222 respectively. A third electrode structure 230 equidistantly zigzags between the interlaced finger electrode structure formed by the first finger electrode structure and the second finger electrode structure, so as to form two capacitor structures with the same capacitance between the first finger electrode structure and the third electrode structure 230, and between the second finger electrode structure and the third electrode structure 230. The capacitance depends on fringe capacitance generated between electrode structures.

In the present embodiment described above, the sizes of the two finger electrode structures are the same, and the coupled areas of the two finger electrode structures to the third electrode structure 230 are also the same. Therefore, the proportion of the two capacitors is 1:1. Moreover, when the effects are generated by external factors, such as different wafer thickness or different density circuit layout beside, the changed ranges of the two capacitors are the same and the capacitance proportion is kept at a fixed value due to the interlaced layout. Also, the interlaced layout and fringe capacitor effects employed by the present embodiment not only keep the original capacitance after the areas of the circuit layout being reduced, but also reduce the stray capacitance generated from the outside of the electrodes. Besides, the first finger electrode structure, the second finger electrode structure, and the third electrode structure 230 could respectively connect to the same electrode structures on different conductive layers through a plurality of first vias 214, a plurality of second vias 224, and a plurality of third vias 234 to increase the capacitance of the capacitor pair by utilizing the stray capacitance generated between the same electrode structures of different conductive layers.

Figure 2B:
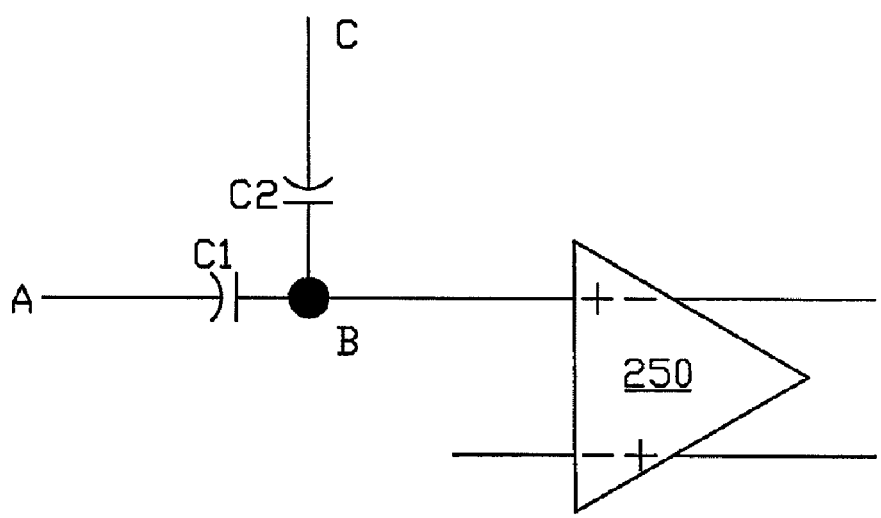
FIG. 2B shows a practical application circuit in accordance with the present invention.

Referring to FIG. 2B, a practical switched-capacitor circuit in accordance with the present invention is illustrated. A contact B is the common contact of a capacitor C1, a capacitor C2, and one input of an electric device 250, such as an operation amplifier. The contact B could be the third electrode structure shown in FIG. 2A, and a contact A and a contact C could be respectively the first finger electrode structure 210 and the second finger electrode structure 220. From the circuit aspect, the stray capacitance between the contact B and the ground is as smaller as better, so that the noise will not be directly coupled from the ground via contact B while the circuit works in high frequency. The capacitor pair structure in accordance with the present invention reduces a traditional flat common electrode to a zigzagged common electrode, such as the third electrode structure 230 shown in FIG. 2A, zigzagging between two interlaced finger electrode structures. Hence, the stray capacitance between the zigzagged common electrode and the ground is also reduced under ⅓ original capacitance. Besides, the capacitor C1 and the capacitor C2 in the present invention can keep a fixed proportion and good match.

Figure 3A:
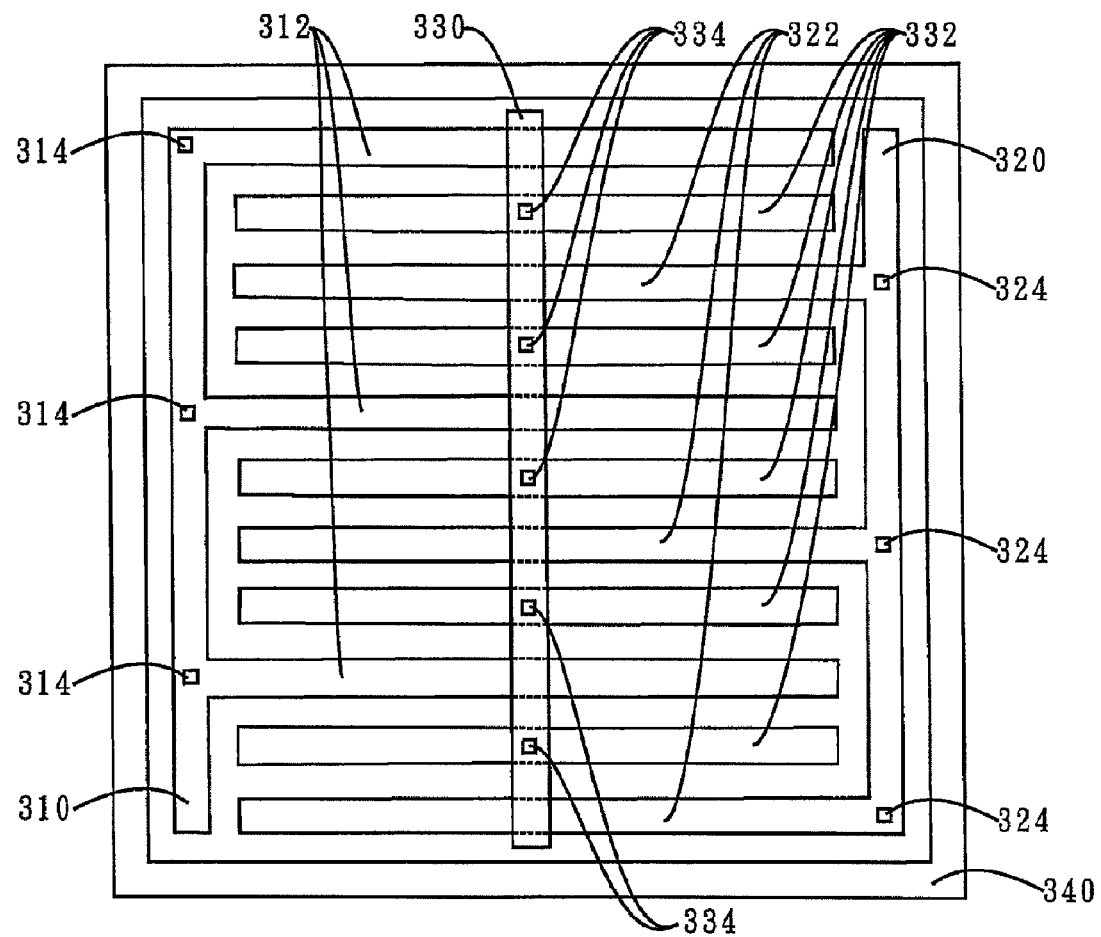
FIG. 3A illustrates the top view of another embodiment of the capacitor pair structure in accordance with the present invention.

Referring to FIG. 3A, another preferred capacitor pair structure in accordance with the present invention is illustrated. A first finger electrode structure includes a first electrode 310 and a plurality of first extended electrodes 312, wherein the plurality of first extended electrodes 312 equidistantly parallel to each other and vertically connect to the first electrode 310. A second finger electrode structure includes a second electrode 320 and a plurality of second extended electrodes 322, wherein the plurality of second extended electrodes 322 equidistantly parallel to each other and vertically connect to the second electrode 320. The two finger electrode structures mentioned above form a so-called interlaced finger electrode structure through the layout of interlacing to each other. This makes the plurality of first extended electrodes 312 be equidistantly and in parallel interlaced among the plurality of first extended electrodes 322 respectively. A third electrode structure includes a fourth electrode 330 and a plurality of third electrodes 332, wherein the plurality of third electrodes 332 equidistantly parallel to each other, equidistantly interlacing between the plurality of first extended electrodes 312 and the plurality of second extended electrodes 322 respectively, and connect to the fourth electrode 330 through a plurality of third vias 334, and the fourth electrode 330 could be position on different conductive layer. A guard dummy structure 340 surrounds the first finger electrode structure, the second finger electrode structure, and the plurality of the third electrodes 332 to isolate the noise outside. For example, the sensed capacitance of the capacitor pair from an adjacent high density circuit could be reduced by the guard dummy structure 340. This increases the accuracy of the capacitance of the present capacitor pair.

In the present embodiment described above, the sizes of the two finger electrode structures are the same, and the coupled areas of the two finger electrode structures to the plurality of third electrodes 332 are also the same. Therefore, the proportion of the two capacitors is still 1:1. Similarly, the first finger electrode structure, the second finger electrode structure, and the plurality of third electrodes 332 could respectively connect to the same electrode structures on different conductive layers through a plurality of first vias 314, a plurality of second vias 324, and the plurality of third vias 334 to increase the capacitance of the capacitor pair by employing the stray capacitance generated between the same electrode structures of different conductive layers.

Figure 3B:
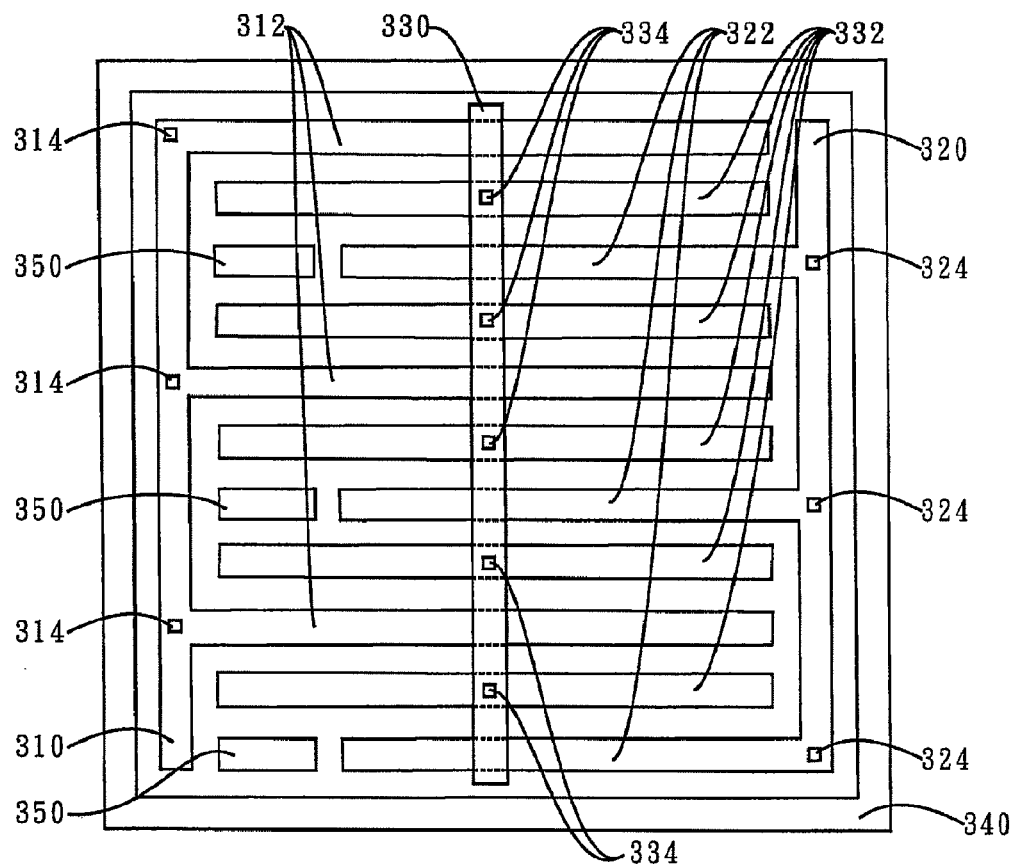
FIG. 3B shows the top view of the different proportion capacitor pair structure shown in FIG. 3A.

Referring to FIG. 3B, a capacitor pair structure with different proportion modified from the capacitor pair structure shown in FIG. 3A is illustrated. The main difference between the capacitor pair structure shown in FIG. 3B and the capacitor pair structure shown in FIG. 3A is that a plurality of second extended electrodes 322 have no the same lengths to a plurality of first extended electrodes 312, so that the fringe capacitance between the plurality of second extended electrodes 322 and a plurality of third electrodes 332 is not equal to the fringe capacitance between the plurality of first extended electrodes 312 and the plurality of third electrodes 332. The proportion of the capacitor pair depends on the length proportion of the plurality of first extended electrodes 312 to the plurality of second extended electrodes 322. That is, any capacitance proportion for the capacitor pair structure can be obtained through adjusting the length proportion of the plurality of first extended electrodes 312 to the plurality of second extended electrodes 322. For example, while the length proportion of the plurality of first extended electrodes 312 to the plurality of second extended electrodes 322 is 1:0.75 or 0.75:1, the proportion of the capacitor pair is respectively 1:0.75 or 0.75:1. A plurality of dummy extended electrodes 350 compensate the lengths of a plurality of shorter extended electrodes, but do not connect to the plurality of shorter extended electrodes, wherein the plurality of shorter extended electrodes could be the plurality of first extended electrodes 312, and also could be the plurality of second extended electrodes 322. By doing so, the defect status on both ends resulted from the space without layouts can be avoided. For example, a crooked extended electrode in the manufacture process causes inaccurate capacitance.

Figure 4A:
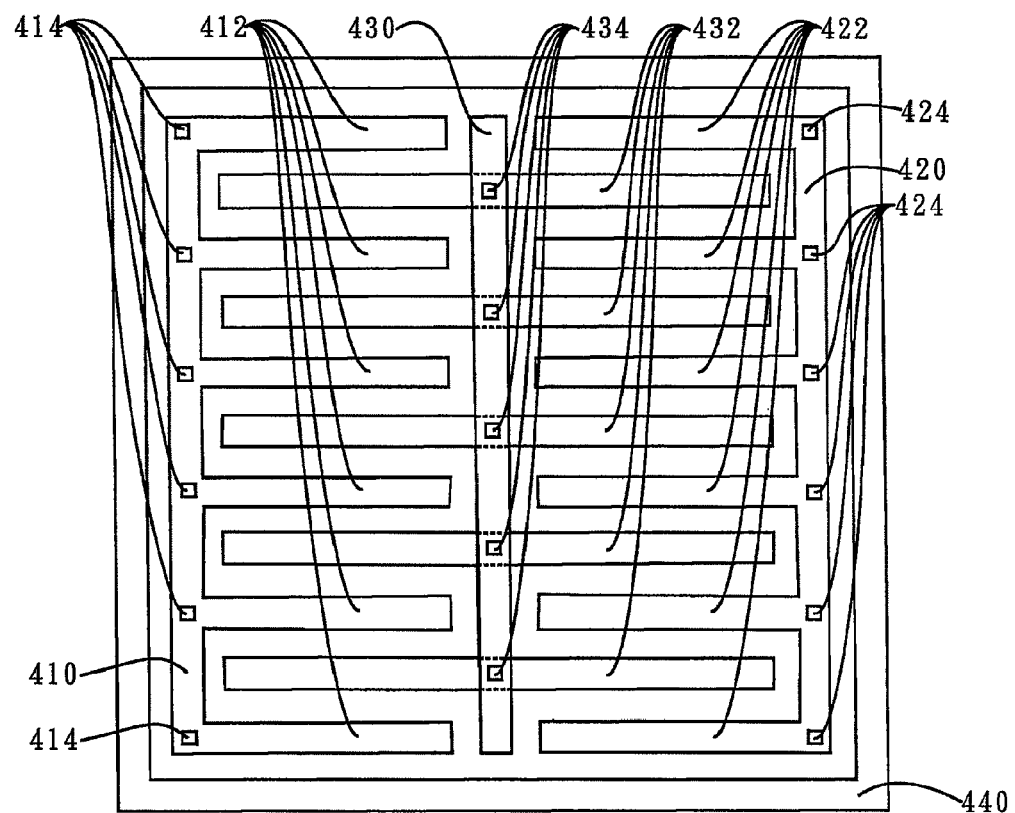
FIG. 4A illustrate the top view of still another embodiment of the capacitor pair structure in accordance with the present invention.

Referring to FIG. 4A, still another preferred capacitor pair structure in accordance with the present invention is illustrated. A first finger electrode structure includes a first electrode 410 and a plurality of first extended electrodes 412, wherein each the plurality of first extended electrodes 412 has a first end and a second end, and the plurality of first extended electrodes 412 equidistantly parallel to each other and vertically connect to the first electrode 410 with the plurality of first ends. A second finger electrode structure includes a second electrode 420 and a plurality of second extended electrodes 422, wherein each the plurality of second extended electrodes 422 has a third end and a fourth end, and the plurality of second extended electrodes 422 equidistantly parallel to each other and vertically connect to the second electrode 420 with the plurality of third ends. The plurality of second ends are horizontally in opposition to the plurality of third ends. This makes the first finger electrode structure and the second finger electrode structure form an opposite finger structure. A third electrode structure includes a fourth electrode 430 and a plurality of third electrodes 432, wherein the plurality of third electrodes 432 equidistantly parallel to each other, connecting to the fourth electrode 430 through a plurality of third vias 434 and, their two ends equidistantly interlace between the plurality of first extended electrodes 412 and between the plurality of second extended electrodes 422 respectively, and the fourth electrode 430 could be position on different conductive layer. A guard dummy structure 440 surrounds the first finger electrode structure, the second finger electrode structure, and the plurality of the third electrodes 432 to isolate the noise outside.

In the present embodiment described above, since the fourth electrode 430 on a different conductive layer has no perpendicularly overlapped areas over the plurality of first extended electrodes 412 and the plurality of second extended electrodes 422, the stray capacitance between the fourth electrode 430 and the extended electrodes cannot be generate to affect the accuracy of the capacitance. Also, the sizes of the two finger electrode structures are the same, and the coupled areas of the two finger electrode structures to the plurality of third electrodes 432 are also the same. Therefore, the proportion of the two capacitors is still 1:1. Likewise, the first finger electrode structure, the second finger electrode structure, and the plurality of third electrodes 432 could respectively connect to the same electrode structures on different conductive layers through a plurality of first vias 414, a plurality of second vias 424, and the plurality of third vias 434 to increase the capacitance of the capacitor pair.

Figure 4B:
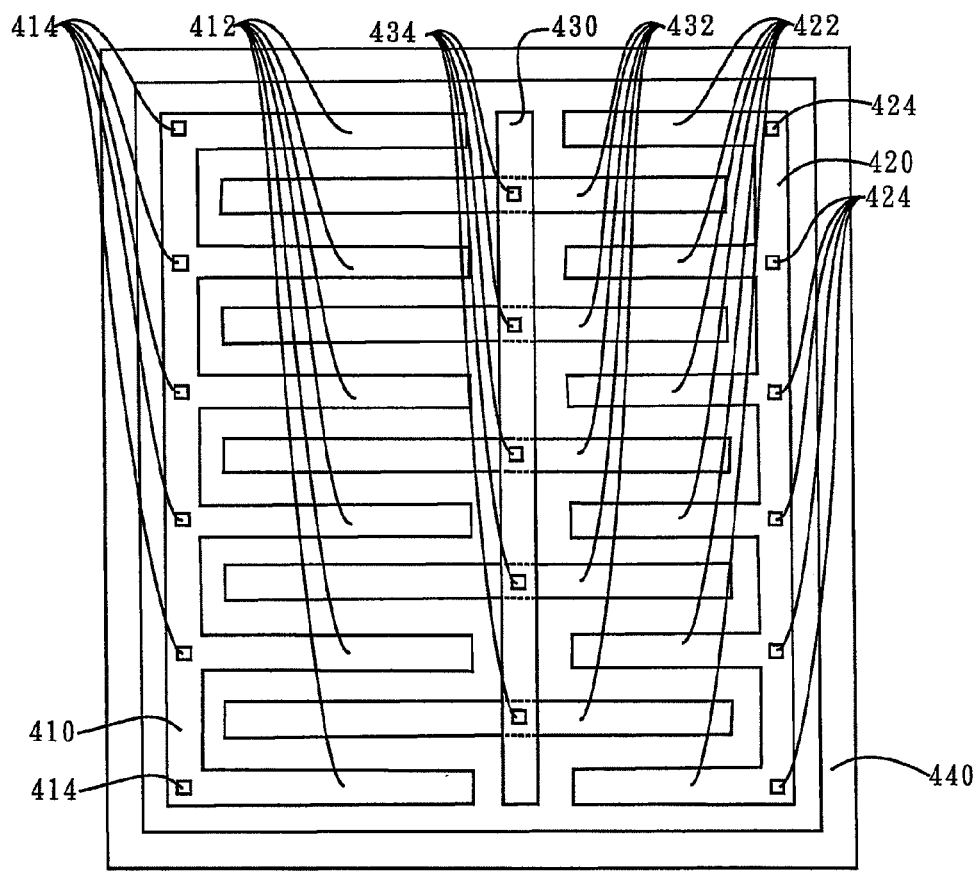
FIG. 4B shows the top view of the different proportion capacitor pair structure shown in FIG. 4A.

Referring to FIG. 4B, a capacitor pair structure with different proportion modified from the capacitor pair structure shown in FIG. 4A is illustrated. The main difference between the capacitor pair structure shown in FIG. 4B and the capacitor pair structure shown in FIG. 4A is that a plurality of second extended electrodes 422 have no the same lengths to a plurality of first extended electrodes 412, so that the fringe capacitance between the plurality of second extended electrodes 422 and a plurality of third electrodes 432 is not equal to the fringe capacitance between the plurality of first extended electrodes 412 and the plurality of third electrodes 432. Likewise, the proportion of the capacitor pair depends on the length proportion of the plurality of first extended electrodes 412 to the plurality of second extended electrodes 422. That is, any capacitance proportion of the capacitor pair structure can be acquired via adjusting the length proportion of the plurality of first extended electrodes 412 to the plurality of second extended electrodes 422.

However, in addition to the above-mentioned disclosures, which change the proportion of the capacitor pair by changing the lengths of the extended electrodes, the proportion of the capacitor pair can be changed through the vias to appropriately connect the same electrode structures of different conductive layers. For example, referring to FIG. 3A again, the first electrode structure and the second electrode structure have the same size, and the fringe capacitance between two of them to the plurality of third electrodes 332 are also the same, so the proportion of the capacitor pair is 1:1. However, while the first electrode and the plurality of third electrodes 332 respectively connect to the same electrode structures on other conductive layers by the plurality of first vias 314 and the plurality of third vias 334, yet the second electrode structure still keeps the fringe capacitance on the single conductive layer, the proportion of the capacitor is then changed to 2:1 or above 2:1. That is, while the same electrode structures on different conductive layer do not overlap with the present electrode structures, the proportion of the capacitor is 2:1 since the capacitance only increases the fringe capacitance of the same electrode structures on the different conductive layer. On the other hand, while the same electrode structures on different conductive layer overlap with the present electrode structures, the proportion of the capacitor is above 2:1 since the capacitance increases not only the fringe capacitance of the same electrode structures on the different conductive layer, but also the stray capacitance between the present electrode structures and the same electrode structures on the different conductive layer. Through suitably calculating and connecting by vias, the capacitor pair structures shown in FIG. 3A and FIG. 4A can have different proportions to meet the practical needs. Likewise, the connection approach also can be utilized in the capacitor pair structures shown in FIG. 3B and FIG. 4B to obtain the higher capacitance.

Although specific embodiments have been illustrated and described, it will be obvious to those skilled in the art that various modifications may be made without departing from what is intended to be limited solely by the appended claims.

What is claimed is:

1. A capacitor pair structure for increasing the match thereof, said capacitor pair structure comprising:
    a first finger electrode structure having a first electrode and a plurality of first extended electrodes, wherein each said plurality of first extended electrodes has a first end and a second end, said plurality of first extended electrodes parallel to each other and said plurality of first ends connect to said first electrode;
    a second finger electrode structure having a second electrode and a plurality of second extended electrodes, wherein each said plurality of second extended electrodes has a third end and a fourth end, said plurality of second extended electrodes parallel to each other and said plurality of third ends connect to said second electrode, said plurality of fourth ends are horizontally in opposition to said plurality of second ends;
    a third electrode structure having a plurality of third electrodes located on a conductive layer, wherein said plurality of third electrodes are physically separate and unconnected from each other on the same conductive layer, and are respectively interlacing between said first finger electrode structure and said second finger electrode structure; and
    a fourth electrode comprising a single conductive strip with an elongated rectangular shape and being located on an adjacent conductive layer different from the conductive layer of said plurality of third electrodes wherein said fourth electrode connects to said plurality of third electrode by a plurality of third vias.

2. The capacitor pair structure according to claim 1, wherein said plurality of first extended electrodes are equidistant to each other, said plurality of second extended electrodes are equidistant to each other, said plurality of third electrodes are equidistant to each other.

3. The capacitor pair structure according to claim 1, wherein said plurality of first extended electrodes perpendicularly connect to said first electrode, said plurality of second extended electrodes perpendicularly connect to said second electrode.

4. The capacitor pair structure according to claim 1, wherein said plurality of third electrodes respectively equidistantly interlaces between said first finger electrode structure and said second finger electrode structure.

5. The capacitor pair structure according to claim 1, further comprising a guard dummy structure, wherein said guard dummy structure surrounds said first finger electrode structure, said second finger electrode structure, and said third electrode structure.

6. The capacitor pair structure according to claim 1, wherein said first finger electrode structure could connect to another first finger electrode structure on another conductive layer by a plurality of first vias, said second finger electrode structure could connect to another second finger electrode structure on another conductive layer by a plurality of second vias, said third electrode structure could connect to another third electrode structure on another conductive layer by a plurality of third vias.

7. The capacitor pair structure according to claim 1, wherein said fourth electrode is arranged to be perpendicularly to said plurality of third electrodes.

8. The capacitor pair structure according to claim 1, wherein said fourth electrode has no perpendicularly overlapped areas over the plurality of first extended electrodes and the plurality of second extended electrodes.

* * * * *